US000001435H

United States Statutory Invention Registration [19]

[11] Reg. Number: H1435

[43] Published: May 2, 1995

Cherne et al.

[54] SOI CMOS DEVICE HAVING BODY EXTENSION FOR PROVIDING SIDEWALL CHANNEL STOP AND BODYTIE

[76] Inventors: Richard D. Cherne, 7920 Timberlake Dr., W. Melbourne, Fla. 32904; Jack E. Clark, II, 277 Hurst Rd., NE., Palm Bay, Fla. 32907; Glenn A. Dejong, 10890 S. Tropical Trail, Merritt Island, Fla. 32952; Richard L. Lichtel, 234 Windover La., Corrales, N. Mex. 87048; Wesley H. Morris, 4612 Pinehurst Dr., S., Austin, Tex. 78747; William H. Speece, 533 Hatcher St., SE., Palm Bay, Fla. 32909

[21] Appl. No.: 780,251

[22] Filed: Oct. 21, 1991

[51] Int. Cl.[6] ..... H01L 23/00

[52] U.S. Cl. ..... 257/347; 257/351; 257/352

[58] Field of Search ..... 357/23.7, 59 E, 59 I, 357/59 G, 59 J, 49; 257/347, 351, 352, 354

[56] References Cited

U.S. PATENT DOCUMENTS

| | | | |
|---|---|---|---|
| 3,997,908 | 12/1976 | Schloetterer et al. | 357/22 |
| 4,053,916 | 10/1977 | Cricchi et al. | 357/23 |
| 4,054,894 | 10/1977 | Heagerty et al. | 257/354 |
| 4,571,609 | 2/1986 | Hatano | 357/41 |
| 4,587,540 | 5/1986 | Jackson | 357/22 |
| 4,620,207 | 10/1986 | Calvielio | 357/22 |
| 4,625,388 | 12/1986 | Rice | 29/571 |
| 4,763,183 | 8/1988 | Ng et al. | 357/23.7 |
| 4,791,464 | 12/1988 | Ipri et al. | 257/354 |
| 4,864,377 | 9/1989 | Widdershoven | 357/23.8 |
| 4,864,380 | 9/1989 | Plus et al. | 257/354 |
| 4,866,291 | 9/1989 | Shimada et al. | 250/578 |
| 4,899,202 | 2/1990 | Blake et al. | 357/23.7 |
| 4,951,113 | 8/1990 | Huang et al. | 357/42 |
| 4,965,213 | 10/1990 | Blake | 357/23.7 |
| 4,989,057 | 1/1991 | Lu | 357/23.7 |
| 5,001,528 | 3/1991 | Bahraman | 257/352 |
| 5,026,656 | 6/1991 | Matloubian et al. | 437/41 |
| 5,034,335 | 7/1991 | Widdershoven | 437/21 |
| 5,034,789 | 7/1991 | Black | 357/23.7 |
| 5,040,037 | 8/1991 | Yamaguchi et al. | 357/23.7 |
| 5,079,604 | 1/1992 | Houston et al. | 357/237 |
| 5,086,326 | 2/1992 | Sinohara et al. | 357/30 |
| 5,185,280 | 2/1993 | Houston et al. | 257/347 |

FOREIGN PATENT DOCUMENTS

| | | | |
|---|---|---|---|
| 27068 | 2/1982 | Japan | 357/23.7 |
| 57-27069 | 2/1982 | Japan | 257/352 |
| 27070 | 2/1982 | Japan | 357/23.7 |
| 178965 | 7/1990 | Japan | 357/23.7 |

*Primary Examiner*—Bernarr E. Gregory

[57] ABSTRACT

An SOI/SOS thin film MOS mesa architecture has its body/channel region extended beyond the source and drain regions and the impurity concentration is increased at a selected portion (e.g. an end portion) of the extended body region, so as to provide both a body tie access location which enables the body/channel region to be terminated to a prescribed bias voltage (e.g. Vss), and a channel stop region that is effective to functionally interrupt a current leakage path or 'parasitic' N-channel that may be induced along sidewall surface of the P-type material of the body/channel region. In another embodiment, ionizing radiation-induced inversion of the sidewalls of the P-type body/channel region is prevented by an asymmetric sidewall channel stop structure formed in opposite end portions of the source region.

3 Claims, 7 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SOI CMOS DEVICE HAVING BODY EXTENSION FOR PROVIDING SIDEWALL CHANNEL STOP AND BODYTIE

FIELD OF THE INVENTION

The present invention relates in general to semiconductor devices and is particularly directed to an SOS/-SOI architecture, the channel/body portion of which is extended beyond the source and drain regions so as to provide a body tie access location and, being more heavily doped than the body/channel portion, serves as a channel stop against 'sidewall' parasitic transistor action between the source and drain regions. The present invention further provides an asymmetric sidewall channel stop structure in opposite end portions of the source region, thereby preventing ionizing radiation-induced inversion of the sidewalls of the P-type body/-channel region.

BACKGROUND OF THE INVENTION

Thin film, co-planar integrated circuits employing silicon-on-insulator (SOI) or silicon-on-sapphire (SOS) CMOS architectures are typically characterized by the use of either air or (oxide) dielectric to provide lateral isolation between adjacent 'mesa' transistors which are formed atop an insulating dielectric (e.g. silicon oxide or sapphire). More particularly, as diagrammatically illustrated in the top view of FIG. 1 and the side view of FIG. 2, a conventional N-channel SOI/SOS thin film MOS transistor structure is typically comprised of a semiconductor (silicon) mesa layer 11, which is disposed atop a substrate-supported dielectric (silicon dioxide) layer 12 and the sidewall perimeter of which is bounded by air or an oxide dielectric layer, shown at 13. This semiconductor mesa structure contains a P-type body/channel region 14 disposed between and immediately contiguous with respective N+ source and drain regions 16 and 18. Overlying the (P-type) channel/body region 14 and extending onto the surrounding support substrate, either coplanar with the top of the mesa as shown in FIG. 2 in the case where the mesa is bounded by an oxide dielectric layer 13, or stepped down to the surface of dielectric layer 12 in the case where the mesa is bounded by air isolation, is a doped polysilicon gate layer 21, insulated from the semiconductor material of the mesa by a thin dielectric layer (e.g. oxide) 22.

Because the surface of P-doped material (here the P-type channel/body region 14) is susceptible to inversion in the presence of ionizing radiation, there is the danger of a leakage path or 'parasitic' channel being induced along the body/channel sidewalls 23, 24 between the source and drain regions 16, 18. Moreover, regardless of the potential for exposure to ionizing radiation, the inability of some manufacturing processes to accurately control the channel doping along the edges of the device (beneath the polysilicon gate overlay 21), and the lack of control of electrostatic charge build-up along surface portions 25, 27 of dielectric layer 13 that is immediately adjacent to P-type silicon body 14, may cause the device to suffer extraordinary current leakage in its OFF state.

Another problem associated with this type of architecture is the fact that the body/channel region 14 of the transistor, being situated atop a dielectric layer, is not readily accessible to be terminated to either a Vdd node or, in the case of an N-channel device, a Vss node, so that the potential of the body/channel region effectively 'floats', which can severely degrade the performance of the transistor (e.g. subject the saturation region of the device to the 'kink' effect and additionally by permitting parasitic NPN devices to be turned on).

SUMMARY OF THE INVENTION

In accordance with the present invention the above drawbacks of conventional SOI/SOS thin film MOS mesa architectures are effectively obviated by extending the body/channel region beyond the source and drain regions and also increasing the impurity concentration at a selected portion (e.g. an end portion) of the extended body region, so as to provide both a body tie access location which enables the body/channel region to be terminated to a prescribed bias voltage (e.g. Vss), and a channel stop region that is effective to functionally interrupt a current leakage path or 'parasitic' N-channel that may be induced along sidewall surface of the P-type material of the body/channel region.

Pursuant to a first embodiment of the present invention, the problem of the inducement of a parasitic sidewall channel within an SOI/SOS field effect transistor architecture is successfully addressed by extending the body/channel region beyond endwall terminations of source and drain regions that are contiguous with the body/channel region, so as to form a pair of body/channel extension regions at opposite ends of the device. The thin film, field effect transistor, being an SOI/SOS mesa structure, includes a semiconductor mesa having a body/channel region of a first conductivity type (e.g. P-type for an N-channel device) formed on a first surface portion of an underlying dielectric layer (e.g. silicon dioxide, sapphire), with its source region of a second conductivity type (e.g. N-type for an N-channel device), formed in the mesa on a second surface portion of the substrate immediately contiguous with the first surface portion and forming a source/body junction with (P-type) body/channel region. A drain region of the second conductivity type (N-type) is formed in the mesa on a third surface portion of the substrate, spaced apart from the second surface portion by the first surface portion therebetween, and being immediately contiguous with the first surface portion and forming a drain/body junction with the body/channel region. A dielectrically insulated (polysilicon) gate layer overlies the body/channel region of the mesa.

Extending the opposite end portions of the P-type mesa body/channel region extend beyond the terminations of the source and drain regions, serves to increase the effective channel length to a value greater than the case where the (P-type) body/channel region terminates 'flush' with the (N+) source and drain regions. Thus, respective body extensions at both ends of the body/channel region beneath the polysilicon gate, by increasing the 'net edge length', will result in a significantly reduced OFF state leakage due to the attenuation of parasitic transistor short channel effects.

In accordance with a second embodiment of the invention, the impurity concentration of end portions of the (P-type) extension regions is increased relative to the impurity concentration of that portion of the body/-channel region disposed between the source and drain regions, thereby forming a pair of P+ channel stops. This relatively high impurity concentration of the end portions of the extension regions insures that the parasitic sidewall threshold is higher than any possible negative threshold shift which might be induced by ionizing radiation. These more heavily doped (P+) end portions of the extension regions are spaced apart from the intermediate portion of the (P-type) body/channel region by respective portions of the extension region of the same doping concentration as the body/channel region itself, so that the more heavily doped (P+) channel stop regions do not form (very low breakdown voltage) P+/N+ junctions with the source and drain regions.

Pursuant to a third embodiment of the invention, the channel stops of the extension regions are configured to provide additional functionality, specifically to provide body tie contact regions, so that the body/channel region may be terminated at a prescribed bias voltage (e.g. Vss, which will substantially reduce parasitic current leakage during the transistor's OFF state). For this purpose, the heavily doped portions of the extension regions protrude to the side of or transverse to the lengthwise direction of the body/channel region and its polysilicon gate overlay, so that a pair of heavily doped (P+) bodytabs project outwardly from beneath and to the side of the gate layer, thereby forming a symmetrical, bidirectional transistor geometry and facilitating the electrical connection of a bias rail to the body/channel region through one or both ends of the device.

In accordance with a fourth embodiment of the invention, the problem of ionizing radiation-induced inversion of the sidewalls of the P-type body/channel region is addressed by means of an asymmetric sidewall channel stop structure formed in opposite end portions of one of the source and drain regions. Specifically, first and second end portions of one (e.g. the N+ source region) of (N+) source and drain mesa regions, which are contiguous with the (P) body/channel mesa region and extend to sidewall edges of the selected one of the source and drain mesa regions, are heavily overdoped with impurities (e.g. P+) of the same conductivity type as the body/channel region, thereby forming a demiurgic channel stop structure having first and second mesa sidewall channel stops immediately adjacent to the ends of the (P) body/channel region and which extend throughout the thickness of the selected source or drain region. The heavy (P+) overdoping ensures that the parasitic sidewall threshold is higher than any possible negative threshold shift that might occur as a result of the incidence of ionizing radiation. Even in the case of a very thick dielectrically filled trench isolation structure where the potential charge generation volume is relatively large, the sidewall remains adequately enhancement mode. Since the P+ channel stops are disposed in the same N+ region, they are physically and electronically separated from the N+ drain/source region on the opposite side of the body/channel region over which the polysilicon gate is formed. Thus, both P+/N+ junctions formed between the high impurity concentration (P+) channel stops and the (N+) material in which they are introduced are into the source region and are always at the same potential, so that the value of reverse bias breakdown voltage is not of concern.

DETAILED DESCRIPTION

Figure 1:
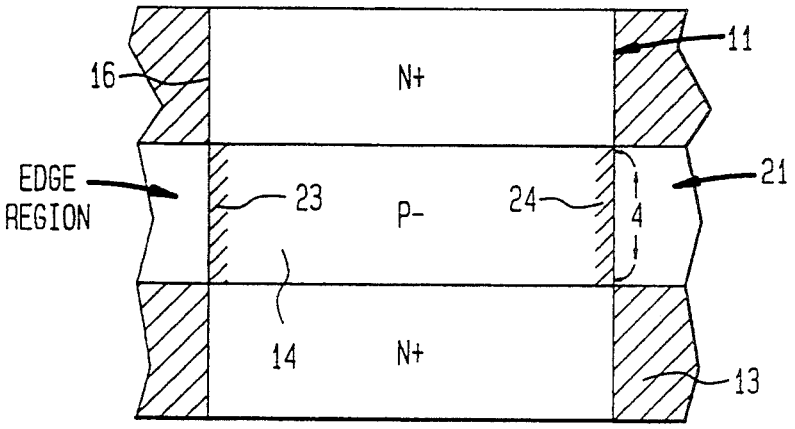
FIG. 1 (PRIOR ART)
FIGS. 1 and 2 are respective diagrammatic top and side views of a conventional N-channel SOI/SOS thin film MOS transistor structure.
Figure 2:
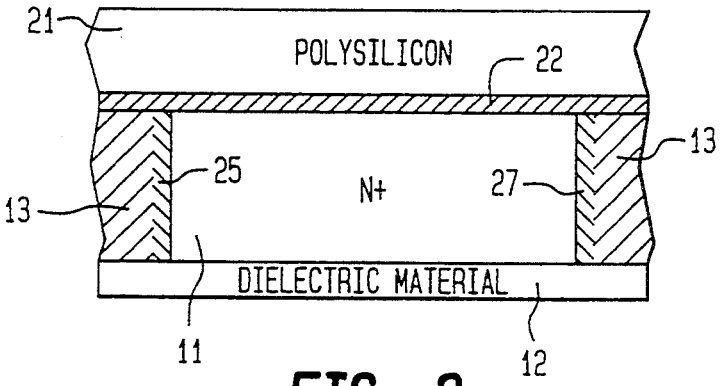
FIG. 2 (PRIOR ART)
Figure 3:
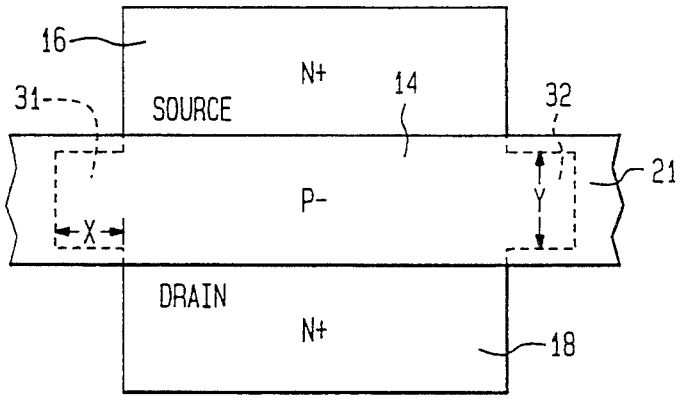
FIGS. 3 and 4 are respective diagrammatic top and side views of an MOS transistor structure having body/channel extension regions in accordance with a first embodiment of the present invention.
Figure 4:
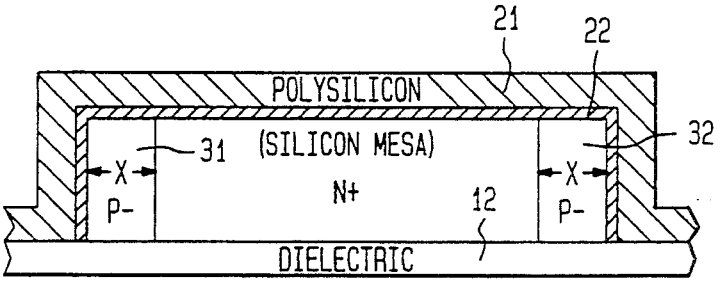

Referring now to FIGS. 3 and 4, respective top and side views of a first embodiment of the present invention show how the conventional thin mesa transistor structure of FIGS. 1 and 2 is modified such that the body/channel region 14 extends beyond its interfaces with each of the source and drain regions, as shown by body/channel extension regions or segments 31, 32. Regions 31, 32 have a prescribed length x and a width y within the dimensions of the gate layer 21 and serve to increase the effective channel length of body/channel region 14 to a value greater than the case where the body/channel region terminates 'flush' with source and drain regions 16, 18 (as shown in FIG. 1). The respective channel/body extensions 31, 32 at both ends of the body/channel region beneath the polysilicon gate, by increasing the 'net edge length' (2x+y), will result in a significantly reduced OFF state leakage due to the attenuation of parasitic transistor short channel effects.

Figure 5:
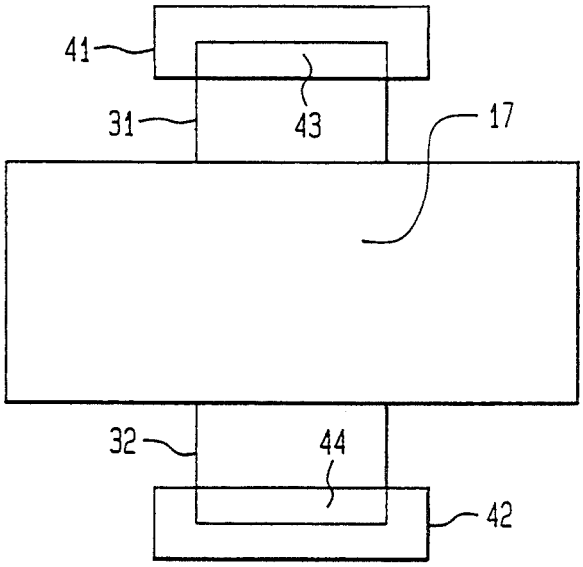
FIGS. 5 and 6 are respective diagrammatic top and side views of an MOS transistor structure having body/channel extension regions in accordance with a second embodiment of the present invention.
Figure 6:
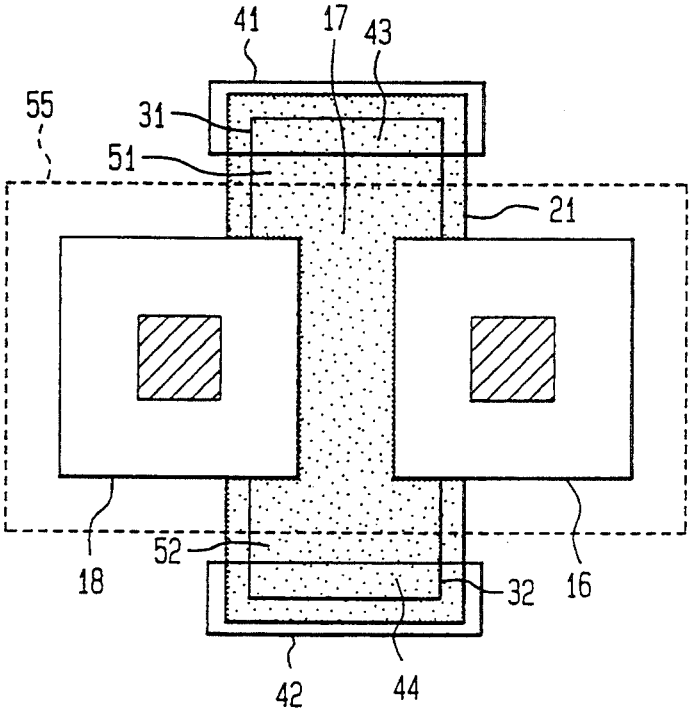

FIGS. 5 and 6 diagrammatically show respective top and side view of a second embodiment of the invention, in which respective high impurity concentration 'tab' regions 41, 42 are introduced to overlap end portions 43, 44 of (P-type) body/channel extension regions 31, 32 so that the impurity concentration of these end portions of the extension regions is increased relative to the impurity concentration of that portion 17 of the body/channel region 14 disposed between the source and drain regions, thereby forming a pair of P+channel stops. This relatively high impurity concentration of the channel stop tab regions 41, 42 insures that the parasitic sidewall threshold is higher than any possible negative threshold shift which might be induced by ionizing radiation. These more heavily doped (P+) tab regions 41, 42 of the extension regions 31, 32 are spaced apart from the endwall edges of source and drain regions 16, 18 by respective portions 51, 52 of the extension regions 31, 32 of the same doping concentration as the body/channel region 14 itself, so that the more heavily doped (P+) channel stop tab regions 41, 42 do not form (very low breakdown voltage) P+/N+ junctions with the source and drain regions 16, 18. The source and drain regions may be formed by an N+ implant using an implant mask the geometry of which overlaps polysilicon gate layer 21, as shown at 55 in FIG. 6.

Figure 7:
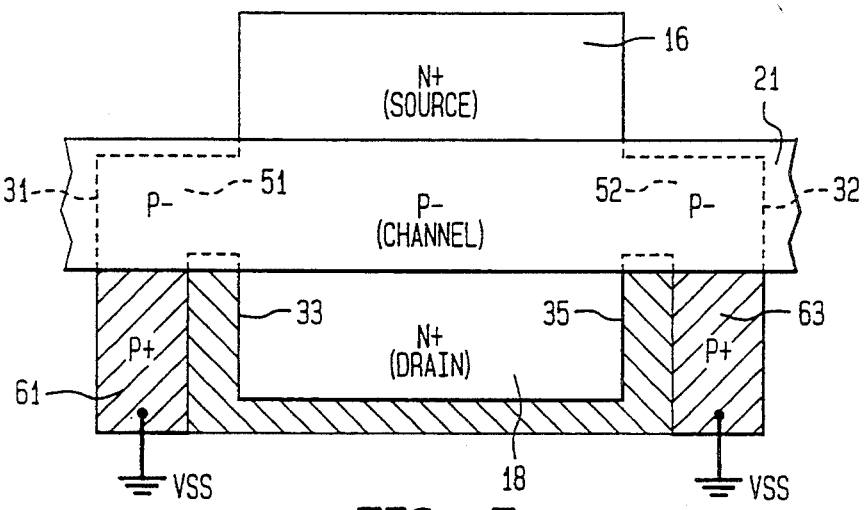
FIGS. 7 and 8 are respective diagrammatic top and side views of an MOS transistor structure having body/channel extension regions in accordance with a third embodiment of the present invention.
Figure 8:
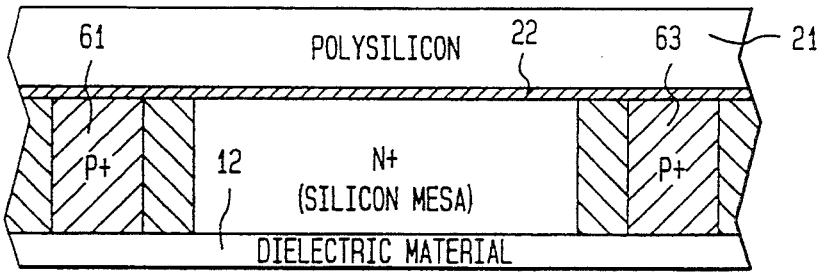

Pursuant to a third embodiment of the invention, the channel stops of the extension regions are configured to provide additional functionality, specifically to provide body tie contact regions, so that the body/channel region may be terminated at a prescribed bias voltage (e.g. Vss, which will substantially reduce parasitic sidewall originating current leakage during the transistor's OFF state). For this purpose, as shown in the diagrammatic top and side views of FIGS. 7 and 8, heavily doped 'bodytab' portions 61, 63 of P-type body/channel extension regions 31, 32 protrude to the side of or transverse to the lengthwise direction of the body/channel region 14 and its polysilicon gate overlay 21, so that the pair of heavily doped (P+) bodytabs 61, 63 project outwardly from beneath and to the side of the gate layer 21, thereby forming a symmetrical, bidirectional transistor geometry and facilitating the electrical connection of a bias voltage rail to the body/channel region from either end of the device. As in the second embodiment heavily doped bodytab regions 61, 63 are spaced apart from the end sidewalls of N+ drain region 18 by extension portions 51, 52, so that the more heavily doped (P+) channel stop tab regions 61, 63 do not form (low reverse breakdown voltage) P+/N+ junctions with the drain region 18.

Figure 9:
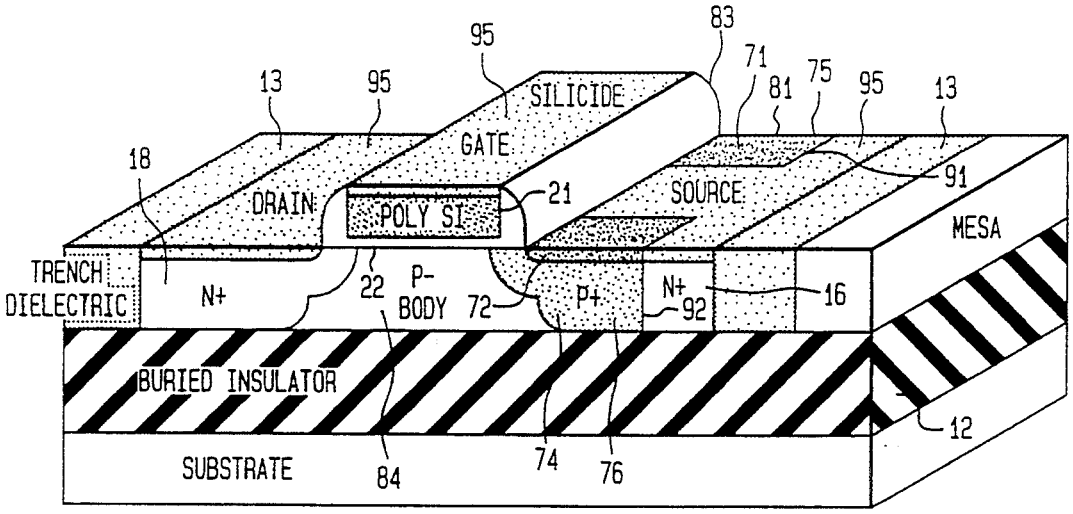
FIGS. 9 and 10 are respective diagrammatic isometric and top views of an asymmetric sidewall channel stop structure in accordance with a fourth embodiment of the present invention.
Figure 10:
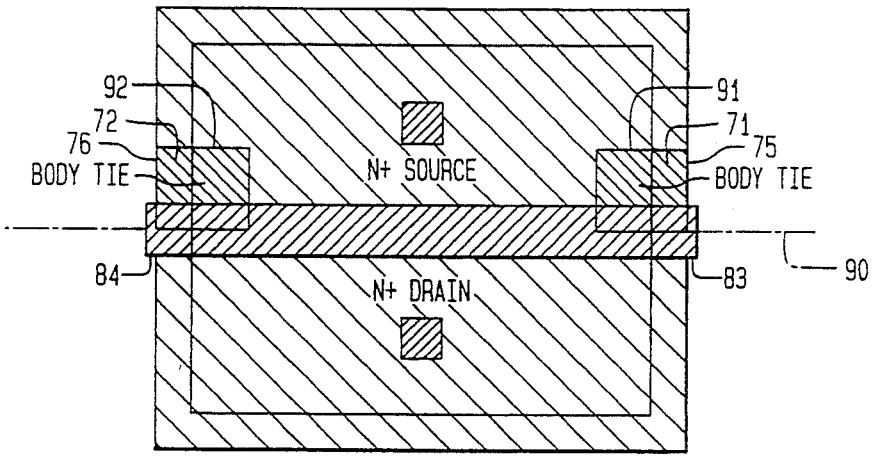

In accordance with a fourth embodiment of the invention, the problem of ionizing radiation-induced inversion of the sidewalls of the P-type body/channel region is addressed by means of an asymmetric sidewall channel stop structure formed in opposite end portions of one of the source and drain regions. Specifically, as diagrammatically illustrated in the isometric sectional view of FIG. 9 and the top view of FIG. 10, first and second end portions 71, 72 of one of N+ source and drain mesa regions are heavily overdoped with impurities of the same conductivity type as the body/channel region. In particular, these P+ end portions 71 and 72 are located such that they are contiguous with the (P) body/channel mesa region 14 and extend to sidewall edges 75, 76 of the source mesa region 16, thereby forming a demiurgic channel stop structure having first and second mesa sidewall channel stops 81, 82 immediately adjacent to ends 83, 84 of the (P) body/channel region 14 and which extend throughout the thickness of the selected region (source region 16). The P+ implant photomask used to define the geometry of channel stop regions 81, 82 is sized and located such that it partially overlaps (e.g. terminates beneath a portion of polysilicon gate 21, as shown in FIG. 9, or it may terminate along the centerline 90 of polysilicon gate 21, as shown in FIG. 10, and also extends beyond the side edge of the gate onto the source region, so as create a partially self-aligned P+ channel stop structure that is contiguous with the P-type body/channel region. Terminating the P+ channel stop implant masking photoresist pattern over polysilicon gate layer 21 guarantees that the P+ implant will not fall off the gate onto either the source or drain region side under statistically controlled misalignment conditions.

Channel stop regions 71, 72 are doped with a P-type impurity during both a lightly doped P source/drain region implant and P+ surface source/drain implant operations, such that the composite doping profile of these regions is sufficient to inhibit sidewall inversion well into the megarad total dose range. The magnitude of P+ implant energy is predetermined to be sufficient to cause a pair of P source and drain regions of an associated complementary P-channel device to bottom out against insulator support layer 12. As a consequence, the P+ implant is similarly effective across the entire sidewall interface surface in the formation of the channel stops 81, 82.

The shape and position of this heavy (P+) overdoping ensures that the sidewalls 83, 84 of the mesa adjacent to the location where gate electrode 21 exits the mesa are P-doped to the magnitude necessary to prevent sidewall inversion. The heavy overdoping also ensures that the parasitic sidewall threshold is higher in magnitude than any possible threshold shift that might occur as a result of the incidence of ionizing radiation. Even in the case of a very thick dielectrically filled trench isolation structure where the potential charge generation volume is relatively large, the sidewall remains adequately enhancement mode. Since P+ channel stops 81, 82 are disposed in the same N+ source region 16, they are physically and electronically separated from the N+ drain region 18 on the opposite side of body/channel region 14 over which polysilicon gate 21 is formed.

Conductive material such as a layer of low resistance silicide 95 is formed atop each of gate layer and source and drain regions, as shown in FIG. 9. Silicide layer 95 conductively bridges channel stop regions 81, 82 and source region 16, so that the body region 14 is inherently shunted to source region 16. Thus, P+/N+ junctions 91, 92 formed between the high impurity concentration P+ channel stops 81, 82 and the N+ material of source region 16 in which they are introduced are at the same potential, so that the reverse bias voltage characteristics of the diode are of no consequence.

Figure 11:
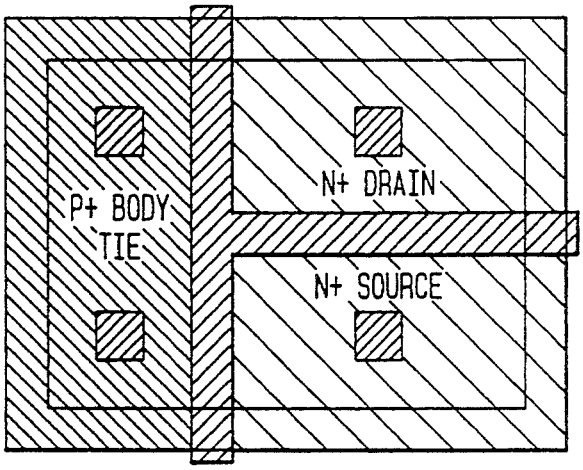
FIG. 11 (PRIOR ART)
FIGS. 11–16 show top plan views of conventional MOS channel stop architectures.
Figure 12:
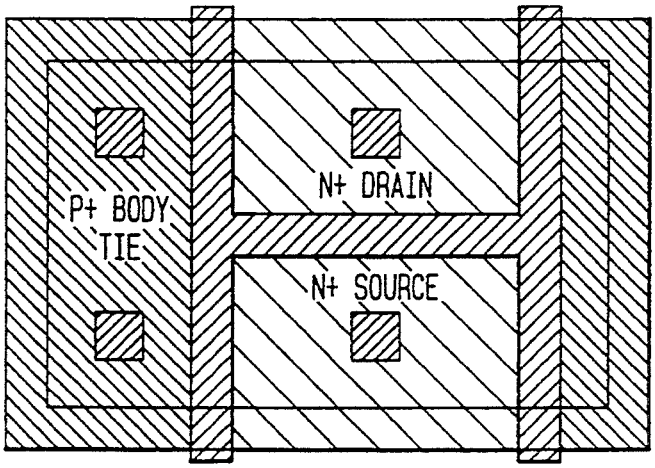
FIG. 12 (PRIOR ART)
Figure 13:
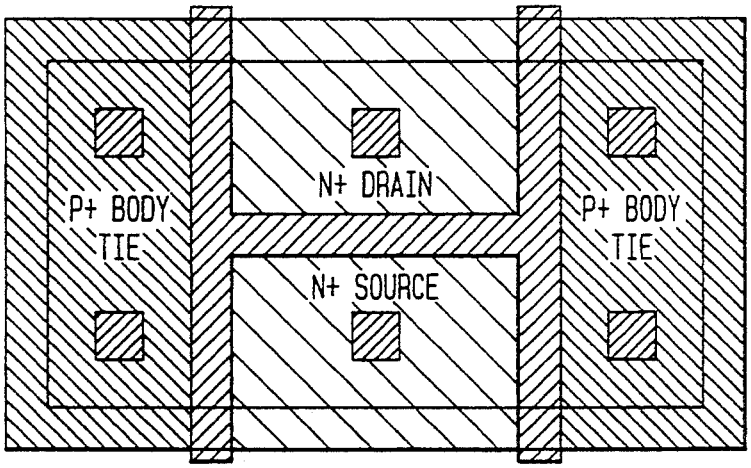
FIG. 13 (PRIOR ART)
Figure 14:
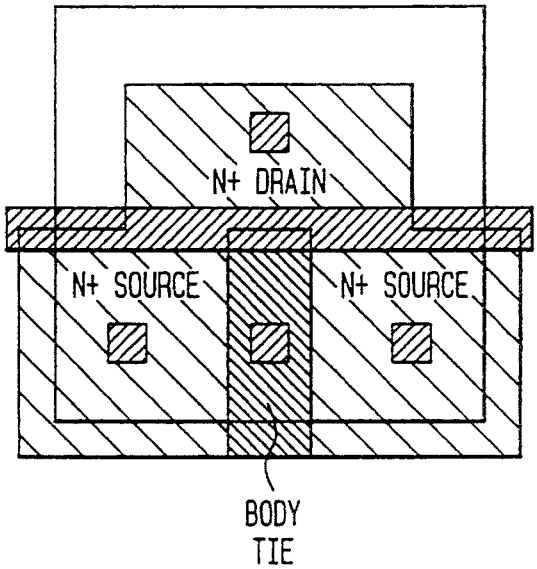
FIG. 14 (PRIOR ART)
Figure 15:
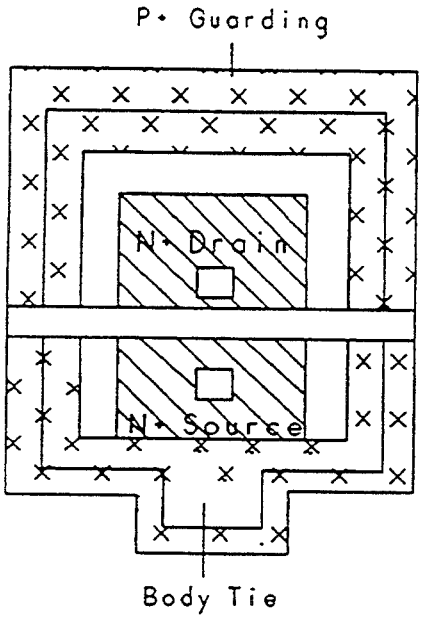
FIG. 15 (PRIOR ART)
Figure 16:
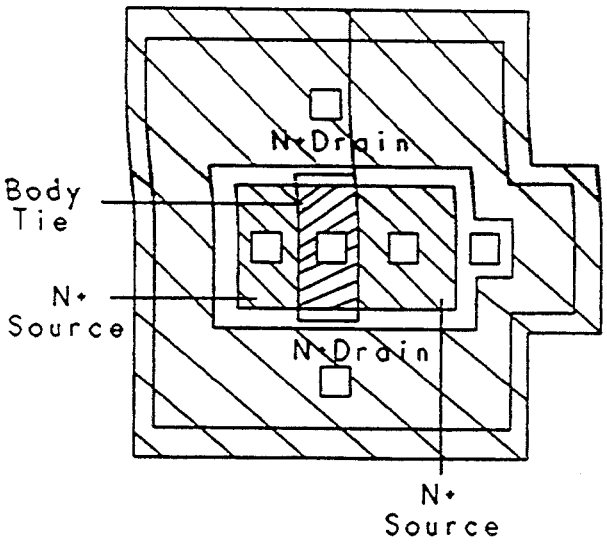
FIG. 16 (PRIOR ART)

The amount of semiconductor real estate necessary to prevent sidewall inversion using the asymmetric channel stop configuration of FIGS. 9 and 10 is considerably reduced compared with other MOS channel stop architectures, shown in FIGS. 11–16, that have been conventionally used for this purpose. Specifically, in the course of carrying out a full self-alignment with the polysilicon gate in a T-gate structure, such as shown in FIG. 11 and an H-gate structure shown in FIGS. 12 and 13, contacts must be added to the channel stop regions in order for the P+ regions to provide body tie capability. On the other hand, as described above, the asymmetric channel stop configuration of the embodiment of FIGS. 9 and 10 is inherently shunted to source region 16 by means of low resistance silicide 95. This bridging silicide layer 95 also eliminates the need for additional contacts and metalization, such as those shown in the structure of FIG. 14, which employs N+ diffusions spaced inwardly away from the mesa edge. In fact, for small transistors, a single, minimum sized source contact to silicide layer 95 will serve to maintain the necessary bias on both sidewall channel stops 81, 82, while also providing bias to the body/channel region 14 and the source region 16.

It will also be appreciated that conventional configurations employing full or partial guardrings (FIG. 15) and circular gate structures (FIG. 16) require significantly larger chip area to implement than do the asymmetric device of FIGS. 9 and 10, and make high density memories and other digital circuits more difficult to design and manufacture. Indeed for guardring structures, at least one additional lithographic and ion implantation step is required prior to the deposition of the gate electrode. On the other hand, in asymmetric device of the present invention no additional fabrication operations, photomasking, or ion implantation steps are required.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A mesa field effect trasistor architecture comprising:

a dielectric support substrate; and a mesa field effect transistor structure disposed on said dielectric support substrate, said mesa field effect transistor structure including a body mesa of a first conductivity type formed on a first surface portion of said dielectric support substrate, said body mesa having first and second sidewalls on opposite sides of said body mesa and first and second endwalls at opposite ends of said body mesa, a source mesa of a second conductivity type formed on a second surface portion of said dielectric support substrate contiguous with said first surface portion, said source mesa having third and fourth sidewalls on opposite sides of said source mesa and third and fourth endwalls at opposite ends of said source mesa, said third sidewall of said source mesa adjoining and forming a source/body junction with said first sidewall of said body mesa, and wherein said third and fourth endwalls of said source mesa adjoin no semiconductor material and are spaced apart from the first and second endwalls of said body mesa, a drain mesa of said second conductivity type formed on a third surface portion of said dielectric support substrate contiguous with said first surface portion and spaced apart from said second surface portion by said first surface portion of said dielectric support substrate, said drain mesa having fifth and sixth sidewalls on opposite sides of said drain mesa, and fifth and sixth endwalls at opposite ends of said drain mesa, said fifth sidewall of said drain mesa adjoining and forming a drain/body junction with said second sidewall of said body mesa, and wherein said fifth and sixth endwalls of said drain mesa adjoint no semiconductor material and are spaced apart from the first and second endwalls of said body mesa, and a gate layer overlying said body mesa and being operative to induce a channel in that portion of said body mesa disposed between and adjoining said source and drain mesas, and wherein said body mesa extends beyond said third endwall of said source mesa and beyond said fifth endwall of said drain mesa to said first endwall thereof as a first body mesa extension, and beyond said forth endwall of said source mesa and beyond said sixth ednwall of said drain mesa to said second endwall thereof as a second body mesa extension, and wherein a first portion of said first body mesa extension underlies said gate layer and is spaced apart from said that portion of said body mesa disposed between and adjoining said third sidewall of said source mesa and said fifth sidewall of said drain mesa by a second portion of said first body mesa extension that is located beyond said third endwall of said source mesa and beyond said fifth endwall of said drain mesa, said first portion of said first body mesa extension having a first impurity concentration greater than a second impurity concentration of said that portion of said body mesa disposed between said source and drain mesa regions, so as to form a first body mesa extension channel stop, and said second portion of said first body mesa extension having a third impurity concentration less than said first impurity concentration of said first portion of said first body mesa extension, and wherein a first portion of said second body mesa extension underlies said gate layer and is spaced apart from said that portion of said body mesa disposed between and adjoining said third sidewall of said source mesa and said fifth sidewall of said drain mesa, by a second portion of said second body mesa extenion that is located beyond said fourth endwall of said source mesa and beyond said sixth endwall of said drain mesa, said first portion of said second body mesa extension having a fourth impurity concentration greater than said second impurity concentration of said that portion of said body mesa disposed between said source and drain mesa regions, so as to form a second body mesa extension channel stop, and said second portion of said second body mesa extension having a fifth impurity concentration less than said fourth impurity concentration of said first portion of said second body mesa extension.

2. A mesa field effect transistor architecture according to claim 1, wherein said first portion of said first body mesa extension is bounded by said first endwall of said body mesa and first and second sidewall end portions of said first and second sidewalls of said body mesa which intersect said first endwall of said body mesa, and wherein said first portion of said second body mesa extension is bounded by said second endwall of said body mesa and third and fourth sidewall end portions of said first and second sidewalls of said body mesa which intersect said second endwall of said body mesa.

3. A mesa field effect transistor architecture according to claim 2, wherein said first portion of said first body mesa extension adjoins first semiconductor material of only said second portion of said first body mesa extension, and wherein said first portion of said second body mesa extension adjoins second semiconductor material of only said second portion of said second body mesa extension.

* * * * *